(12) United States Patent
Jin

(10) Patent No.: US 12,406,164 B2
(45) Date of Patent: *Sep. 2, 2025

(54) DISPLAY DEVICE AND METHOD OF FABRICATING DISPLAY DEVICE

(71) Applicant: Samsung Display Co., LTD., Yongin-si (KR)

(72) Inventor: Kyong Bin Jin, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/587,916

(22) Filed: Feb. 26, 2024

(65) Prior Publication Data

US 2024/0265225 A1 Aug. 8, 2024

Related U.S. Application Data

(63) Continuation of application No. 17/701,133, filed on Mar. 22, 2022, now Pat. No. 11,941,467.

(30) Foreign Application Priority Data

Mar. 23, 2021 (KR) ........................ 10-2021-0037130

(51) Int. Cl.
| | |
|---|---|
| *G06K 19/06* | (2006.01) |
| *H10K 59/80* | (2023.01) |
| *C03C 15/00* | (2006.01) |
| *H10K 50/84* | (2023.01) |

(52) U.S. Cl.
CPC ..... *G06K 19/06037* (2013.01); *H10K 59/873* (2023.02); *C03C 15/00* (2013.01); *H10K 50/84* (2023.02)

(58) Field of Classification Search
CPC . G06K 19/06037; H10K 77/111; H10K 50/17
USPC .......................................................... 235/494
See application file for complete search history.

(56) References Cited

U.S. PATENT DOCUMENTS

| | | | |
|---|---|---|---|
| 10,485,119 B2 | 11/2019 | Do et al. | |
| 11,528,813 B2 | 12/2022 | Jeong et al. | |
| 11,941,467 B2* | 3/2024 | Jin | G06K 19/06159 |
| 12,089,464 B2* | 9/2024 | Jia | H10K 50/80 |

(Continued)

FOREIGN PATENT DOCUMENTS

| | | |
|---|---|---|
| JP | 2003255847 A | 9/2003 |
| JP | 2013044782 A | 3/2013 |

(Continued)

OTHER PUBLICATIONS

Non-Final Office Action issued Jun. 16, 2023, in U.S. Appl. No. 17/701,133.

(Continued)

*Primary Examiner* — Ahshik Kim
(74) *Attorney, Agent, or Firm* — CANTOR COLBURN LLP

(57) ABSTRACT

A display device includes a cover window comprising a flat portion and a curved portion connected to the flat portion; a printed layer disposed across the flat portion and the curved portion of the cover window; a buffer layer provided on the printed layer; a code printed layer provided on the buffer layer; and a plurality of grooves penetrating through the code printed layer.

19 Claims, 15 Drawing Sheets

(56) References Cited

U.S. PATENT DOCUMENTS

| | | |
|---|---|---|
| 2012/0044636 A1 | 2/2012 | Rothkopf et al. |
| 2017/0077439 A1 | 3/2017 | Lee et al. |
| 2018/0088631 A1 | 3/2018 | Park et al. |
| 2020/0262194 A1 | 8/2020 | Shim et al. |
| 2021/0232186 A1 | 7/2021 | Tian et al. |
| 2021/0271002 A1* | 9/2021 | Koo .................. B32B 27/365 |
| 2022/0089477 A1 | 3/2022 | Lee et al. |
| 2022/0100027 A1 | 3/2022 | Li et al. |

FOREIGN PATENT DOCUMENTS

| | | |
|---|---|---|
| KR | 1020110124598 A | 11/2011 |
| KR | 1020130128711 A | 11/2013 |
| KR | 20170032958 | 3/2017 |
| KR | 1020170033487 A | 3/2017 |
| KR | 1020200085402 A | 7/2020 |
| KR | 20200100904 | 8/2020 |

OTHER PUBLICATIONS

Notice of Allowance issued Nov. 22, 2023, in U.S. Appl. No. 17/701,133.

* cited by examiner

DISPLAY DEVICE AND METHOD OF FABRICATING DISPLAY DEVICE

CROSS REFERENCE TO RELATED APPLICATION

This application is a Continuation of U.S. patent application Ser. No. 17/701,133, filed on Mar. 22, 2022, which claims priority from and the benefit of Korean Patent Application No. 10-2021-0037130, filed on Mar. 23, 2021, each of which is hereby incorporated by reference for all purposes as if fully set forth herein.

BACKGROUND

Field

Embodiments of the invention relate generally to a display device, and a method of fabricating the same.

Discussion of the Background

Display devices become more and more important as multimedia technology evolves. Accordingly, a variety of types of display devices such as liquid-crystal display (LCD) devices and organic light-emitting display (OLED) devices are currently used.

A display device may include a cover window that forms the exterior of the display device and protects a display panel. Such a cover window may have a flat plate shape or may be bent or curved to have a curvature depending on the design of the display device. An identification mark such as a Quick Response code (QR code) may be printed on a cover window for identification of the cover window during a process of fabricating a display device.

The above information disclosed in this Background section is only for understanding of the background of the inventive concepts, and, therefore, it may contain information that does not constitute prior art.

SUMMARY

Devices and methods according to embodiments of the invention are capable of enabling viewing of a bar code, a QR code, or an alignment mark on a display panel of a display device during manufacture of the display device, while also preventing the bar code, QR code, or alignment mark from being visible outside of the display device after the manufacture of the display device has been completed.

Aspects of the present disclosure provide a display device that allows a QR code to be identified easily during a fabricating process while preventing the QR code from being noticed from the outside after the fabricating process has been completed.

Additional features of the inventive concepts will be set forth in the description which follows, and in part will be apparent from the description, or may be learned by practice of the inventive concepts.

According to an embodiment, a display device comprises a cover window comprising a flat portion and a curved portion connected to the flat portion; a printed layer disposed across the flat portion and the curved portion of the cover window; a buffer layer provided on the printed layer; a code printed layer provided on the buffer layer; and a plurality of grooves penetrating through the code printed layer.

According to another embodiment, a display device comprises a cover window comprising a flat portion and a curved portion connected to the flat portion; a printed layer disposed on the flat portion and the curved portion of the cover window and comprising a plurality of layers; a code printed layer on the buffer layer; and a plurality of grooves penetrating through the code printed layer.

According to still another embodiment, a method of fabricating a display device, the method comprises forming a printed layer across a flat portion of a cover window and a curved portion connected to the flat portion; forming a buffer layer on the printed layer; forming a code printed layer on the buffer layer; and laser etching the code printed layer.

According to an embodiment, it is possible to allow a QR code to be identified easily during one period of time (e.g., when a display device is being fabricated) while preventing the QR code from being noticed from the outside during a later period of time (e.g., when the display is being used by a user after a fabricating process has been completed).

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION OF THE EMBODIMENTS

Figure 1:
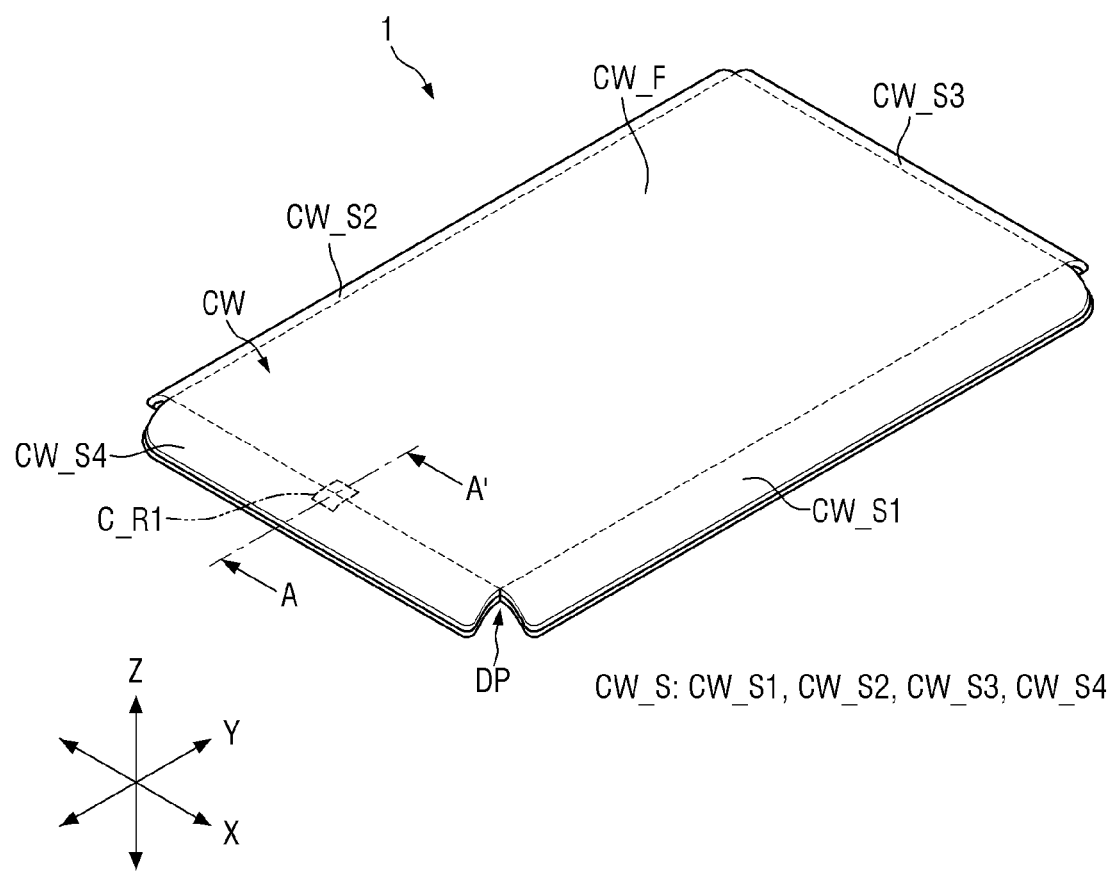
FIG. 1 is a perspective view of a display device according to an embodiment that has been constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z-axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described with reference to the attached drawings.

Figure 2:
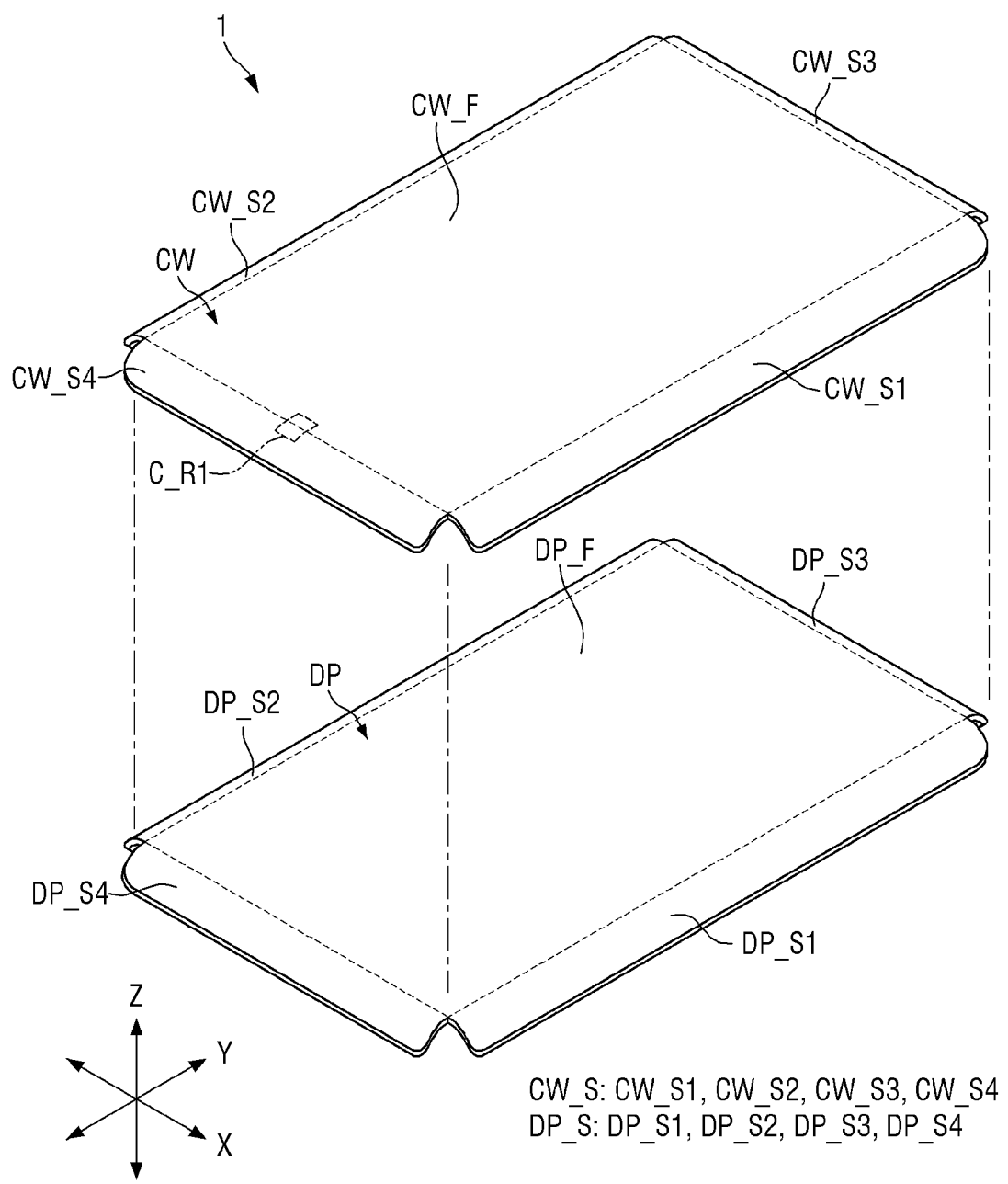
FIG. 2 is an exploded, perspective view of a display device according to an embodiment.

FIG. 1 is a perspective view of a display device according to an embodiment that is constructed according to principles of the invention. FIG. 2 is an exploded, perspective view of a display device according to an embodiment.

In the following description, a first direction X, a second direction Y and a third direction Z are different directions and cross one another. For example, the first direction X may be a width direction, the second direction Y may be a length direction, and the third direction Z may be a thickness direction and/or a height direction. Each of the first direction X, the second direction Y and the third direction Z may include two or more directions. For example, the third direction Z may include an upward direction toward the upper side of the drawings, and a downward direction toward the lower side of the drawings. In this instance, one surface of an element that faces the upper side may be referred to as an upper surface, while the opposite surface of the element that faces the lower side may be referred to as a lower surface. The upward direction, the downward direction, the upper surface and the lower surface may be referred to as a front direction, a rear direction, a front surface and a rear surface, respectively. It is to be noted that the directions and names are relative and are not limited by those described above.

A display device 1 displays moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard, and the Internet of Things (IoT).

The display device 1 may include a cover window CW and a display panel DP.

The cover window CW may be disposed on the upper surface of the display panel DP. The cover window CW may be disposed to cover the upper surface of the display panel DP to protect the display panel DP.

The cover window CW may be made of, for example, a transparent insulating material such as glass and plastic. The cover window CW may be rigid or may have flexibility so that it can be bent.

The cover window CW may include a flat portion CW_F and a plurality of curved portions CW_S.

The flat portion CW_F of the cover window CW may be disposed to form the upper surface of the display device 1. The upper surface of the display device 1 may refer to the front surface of the display panel DP on which images are displayed.

The flat portion CW_F of the cover window CW may be disposed on a flat portion DP_F of the display panel DP to be described later. The flat portion CW_F of the cover window CW may overlap the flat portion DP_F of the display panel DP in the thickness direction. The flat portion CW_F of the cover window CW may be extended in parallel to the first direction X and the second direction Y. The flat portion CW_F of the cover window CW may have a substantially rectangular shape having two shorter sides in the first direction X and two longer sides in the second direction Y when viewed from the top. It should be understood that the embodiments described herein are not limited thereto. The flat portion CW_F of the cover window CW may have other polygonal shapes, a circular shape or an elliptical shape when viewed from the top.

The curved portions CW_S of the cover window CW may be disposed at edges of the flat portion CW_F of the cover window CW. The curved portions CW_S of the cover window CW may be connected to the flat portion CW_F of the cover window CW. The curved portions CW_S of the cover window CW may be extended from the flat portion CW_F of the cover window CW to be bent in the thickness direction, specifically, the downward direction. The downward direction may indicate the rear side opposite to the front side on which images are displayed.

The curved portions CW_S of the cover window CW may be disposed to surround at least some of the edges of the flat portion CW_F of the cover window CW. The curved portions CW_S of the cover window CW may be disposed on at least one of both shorter sides or both longer sides of the flat portion CW_F of the cover window CW. According to an embodiment, the four curved portions CW_S of the cover window CW may be disposed to surround all of the both shorter sides and both longer sides of the flat portion CW_F of the cover window CW. It should be understood that the embodiments described herein are not limited thereto. Two curved portions CW_S of the cover window CW may be disposed on the two longer sides or the both shorter sides of the flat portion CW_F of the cover window CW, respectively, or one curved portion CW_S of the cover window CW may be disposed on one of the both longer sides or one of the both shorter sides of the flat portion CW_F of the cover window CW. The number and arrangement of the curved portions CW_S of the cover window CW may vary depending on the design of the display device 1.

The curved portions CW_S of the cover window CW may include a first curved portion CW_S1, a second curved portion CW_S2, a third curved portion CW_S3 and a fourth curved portion CW_S4.

The first curved portion CW_S1 and the second curved portion CW_S2 of the cover window CW may be disposed on the first side and the second side of the flat portion CW_F of the cover window CW, respectively, and the third curved portion CW_S3 and the fourth curved portion CW_S4 may be disposed on the third side and the fourth side of the flat portion CW_F of the cover window CW, respectively. In the example shown in FIGS. 1 and 2, the first side, the second side, the third side and the fourth side of the flat portion CW_F of the cover window CW may be the longer side located at the lower right side, the longer side located at the upper left side, the shorter side located at the upper right side, and the shorter side located at the lower left side, respectively. It should be understood that the embodiments described herein are not limited thereto. For example, at least one of the first curved portion CW_S1, the second curved portion CW_S2, the third curved portion CW_S3 and the fourth curved portion CW_S4 of the cover window CW may be eliminated.

The display panel DP may include light-emitting elements. For example, the display panel DP may be an organic light-emitting display panel using organic light-emitting diodes including organic emissive layer, a micro light-emitting diode display panel using micro LEDs, a quantum-dot light-emitting display panel including quantum-dot light-emitting diodes including an quantum-dot emissive layer, or an inorganic light-emitting display panel using inorganic light-emitting elements including an inorganic semiconductor. According to an embodiment, the display panel DP may be, but is not limited to, an organic light-emitting display panel.

The display panel DP may be attached on a concave lower surface formed by the flat portion CW_F and the curved portions CW_S of the cover window CW. The display panel DP may be flexible and accordingly may be bent to conform to the shape of the lower surface of the cover window CW and attached to the cover window CW. According to an embodiment, the display panel DP and the cover window CW may have generally the same or similar shapes, but the embodiments described herein are not limited thereto. The display panel DP and the cover window CW may have different shapes.

The display panel DP may include a flat portion DP_F and a plurality of curved portions DP_S.

The flat portion DP_F of the display panel DP may be disposed on the lower surface CW_FR_S of the flat portion CW_F of the cover window CW. The flat portion DP_F of the display panel DP and the flat portion CW_F of the cover window CW may overlap each other in the thickness direction.

The flat portion DP_F of the display panel DP may be flatly extended in parallel to the first direction X and the second direction Y. The flat portion DP_F of the display panel DP may have a substantially rectangular shape having two shorter sides in the first direction X and two longer sides in the second direction Y when viewed from the top. It should be understood that the embodiments described herein are not limited thereto. The flat portion DP_F of the display panel DP may have other polygonal shapes, a circular shape or an elliptical shape when viewed from the top.

The curved portions DP_S of the display panel DP may be disposed at the edges of the flat portion DP_F of the display panel DP. The curved portions DP_S of the display panel DP may be connected to the flat portion DP_F of the display panel DP. The curved portions DP_S of the display panel DP may be extended from the flat portion DP_F of the display panel DP to be bent in the thickness direction, specifically, the downward direction. The downward direction may indicate the rear side opposite to the front side on which images are displayed.

The curved portions DP_S of the display panel DP may be disposed to surround at least some of the edges of the flat portion DP_F of the display panel DP. The curved portions DP_S of the display panel DP may be disposed on at least one of both shorter sides or both longer sides of the flat portion DP_F of the display panel DP. According to an embodiment, the four curved portions DP_S of the display panel DP may be disposed to surround all of the both shorter sides and both longer sides of the flat portion DP_F of the display panel DP. It should be understood that the embodiments described herein are not limited thereto. Two curved portions DP_S of the display panel DP may be disposed on the two longer sides or the both shorter sides of the flat portion DP_F of the display panel DP, respectively, or one curved portion DP_S of the display panel DP may be disposed on one of the both longer sides or one of the both shorter sides of the flat portion DP_F of the display panel DP. The number and arrangement of the curved portions DP_S of the display panel DP may vary depending on the design of the display device 1.

The curved portion DP_S of the display panel DP may be disposed on the lower surface of the curved portions CW_S of the cover window CW. The curved portions DP_S of the display panel DP may overlap the curved portions CW_S of the cover window CW. The curved portions DP_S of the display panel DP may be bent in the same direction as the curved portions CW_S of the cover window CW and may have a curvature substantially equal to that of the curved portions CW_S of the cover window CW.

The curved portions DP_S of the display panel DP may include a first curved portion DP_S1, a second curved portion DP_S2, a third curved portion DP_S3 and a fourth curved portion DP_S4.

The first curved portion DP_S1 and the second curved portion DP_S2 of the display panel DP may be disposed on the first side and the second side of the flat portion DP_F of the display panel DP, respectively, and the third curved portion DP_S3 and the fourth curved portion DP_S4 may be disposed on the third side and the fourth side of the flat portion DP_F of the display panel DP, respectively. In the example shown in FIGS. 1 and 2, the first side, the second side, the third side and the fourth side of the flat portion DP_F of the display panel DP may be the longer side located at the lower right side, the longer side located at the upper left side, the shorter side located at the upper right side, and the shorter side located at the lower left side, respectively. It should be understood that the embodiments described herein are not limited thereto. For example, at least one of the first curved portion DP_S1, the second curved portion DP_S2, the third curved portion DP_S3 and the fourth curved portion DP_S4 of the display panel DP may be eliminated.

Referring to FIGS. 1 and 2, the cover window CW may further include at least one identification region C_R1.

The identification region C_R1 may be disposed across the flat portion CW_F and the curved portions CW_S of the cover window CW. The identification region C_R1 may be disposed across the flat portion CW_F of the cover window CW and the curved portion CW_S connected to the shorter side of the flat portion CW_F. According to an embodiment, the identification region C_R1 may be disposed across the flat portion CW_F and the curved portion CW_S overlapping the bending area BA and the pad area PA, e.g., the fourth curved portion CW_S4. It should be understood that the embodiments described herein are not limited thereto. The identification region C_R1 may be disposed across the flat portion CW_F and the curved portion CW_S which is connected to the shorter side of the flat portion CW_F and does not overlap the bending area BA and the pad area PA, e.g., the third curved portion CW_S3. In addition, the identification region C_R1 may be disposed across the flat portion CW_F and the curved portion CW_S of the cover window CW, which is connected to the longer side of the flat portion CW_F, e.g., the first curved portion CW_S1 and the second curved portion CW_2.

The identification region C_R1 may be disposed at the center portion of the boundary between the flat portion CW_F and the curved portion CW_S. According to an embodiment, the identification region C_R1 may be disposed at the center portion of the boundary between the flat portion CW_F and the fourth curved portion CW_S4, but the embodiments described herein are not limited thereto. The identification region C_R1 is disposed across the flat portion CW_F and the curved portion CW_S, and may be disposed adjacent to a corner of the flat portion CW_F. Although one identification region C_R1 is shown in the example shown in FIGS. 1 and 2, but the embodiments described herein are not limited thereto. More than one identification regions C_R1 may be disposed.

As will be described later, a pattern containing information for identifying the cover window CW during the process may be disposed in the identification region C_R1. As will be described later, the pattern may be formed by a code printed layer CPRL (see in FIG. 3) and a plurality of grooves GP (see FIG. 3) disposed in the identification region C_R1. According to an embodiment, the pattern may be, but is not limited to, a QR code. The pattern may include, for example, various types of identification marks that can be recognized by a vision camera, such as an alignment mark and a barcode.

Hereinafter, the identification region C_R1 will be described in more detail with further reference to FIGS. 3 to 4.

Figure 3:
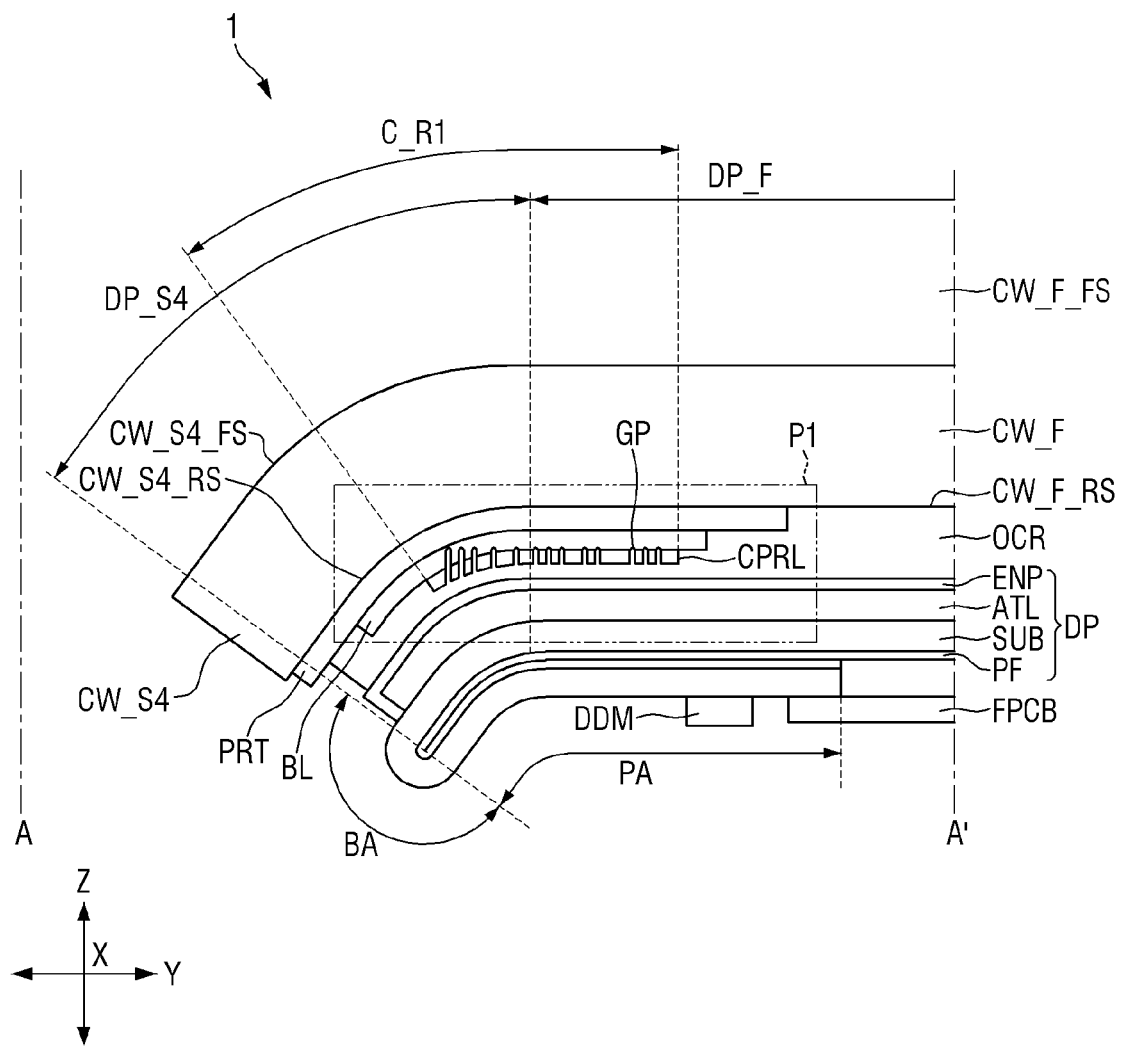
FIG. 3 is a cross-sectional view taken along line A-A' of FIG. 1.

FIG. 3 is a cross-sectional view taken along line A-A' of FIG. 1. FIG. 4 is an enlarged cross-sectional view of portion P1 of FIG. 3. FIG. 5 is a plan view of a code printed layer according to an embodiment.

According to an embodiment, the structure of the fourth curved portion CW_S4 of the cover window CW of the display device 1 may be substantially identical or similar to the structure of the other curved portions CW_S of the cover window CW except the bending area BA and the pad area PA. Therefore, the structure of the fourth curved portion CW_S4 of the cover window CW will be mainly described below.

Referring to FIG. 3, the display panel DP may further include a substrate SUB, an active element layer ATL on the substrate SUB, and an encapsulation layer ENP on the active element layer ATL.

The substrate SUB may be a flexible substrate that can be bent, folded, or rolled and may be made of plastic. For example, the substrate SUB may be made of polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the substrate SUB may include a metallic material.

Referring to FIGS. 1 and 2, the substrate SUB may be disposed across the flat portion DP_F and the curved portions DP_S of the display panel DP. Specifically, the substrate SUB may be disposed across the flat portion DP_F, the first curved portion CW_S1, the second curved portion CW_S2, the third curved portion CW_S3 and the fourth curved portion CW_S4 of the display panel DP. That is to say, the shape of the substrate SUB may be substantially identical to the overall shape of the display panel DP shown in FIGS. 1 and 2.

The substrate SUB may further include a bending area BA and a pad area PA connected thereto.

The bending area BA may be connected to the curved portion CW_S. According to an embodiment, the bending area BA is connected to the fourth curved portion DP_S4 of the display panel DP, but the location of the bending area BA is not limited thereto. The bending area BA may be extended to protrude from the curved portion CW_S, and may be bent to have a curvature as shown in FIG. 3 below. When the curved portion CW_S is eliminated, the bending area BA may be connected to the flat portion DP_F of the display panel DP.

The pad area PA may be extended from the bending area BA. When the bending area BA is bent, it may be located upside down under the lower surface of the display panel DP. In such case, the pad area PA may overlap the curved portion DP_S and the flat portion DP_F of the display panel DP in the thickness direction. It should be understood that the embodiments described herein are not limited thereto. The bending area BA and the pad area PA may be replaced with a flexible film and a circuit board, respectively.

As described above, the structure of the fourth curved portion CW_S4 of the cover window CW may be substantially identical or similar to the structure of the other curved portions CW_S of the cover window CW except the bending area BA and the pad area PA. That is to say, the bending area BA and the pad area PA may be eliminated from the other curved portions CW_S of the cover window CW.

The active element layer ATL may be disposed on one surface of the substrate SUB. The surface of the substrate SUB may be the upper surface of the substrate SUB that is positioned in the flat portion DP_F and the fourth curved portion DP_S4 of the display panel DP and faces the cover window CW in cross section. It should be understood that the embodiments described herein are not limited thereto. The active element layer ATL may be disposed only in the flat portion DP_F of the display panel DP. The active element layer ATL may emit light for displaying images on the screen of the display device 1. The active element layer ATL may include light-emitting elements emitting light and thin-film transistors driving the light-emitting elements.

A thin-film encapsulation layer ENP may be disposed on the active element layer ATL. The thin-film encapsulation layer ENP may encapsulate the active element layer ATL to prevent the active element layer ATL from being exposed to moisture or air. The display device 1 may further include a polarization layer and/or a touch layer disposed on the thin-film encapsulation layer ENP.

The display device 1 may further include a transparent coupling layer OCR coupling the cover window CW with the display panel DP.

The transparent coupling layer OCR may be interposed between the cover window CW and the display panel DP. The transparent coupling layer OCR may be optically clear. For example, the transparent coupling layer OCR may include an optically clear adhesive and an optically clear resin.

The display panel DP may further include a protective film layer PF disposed on the lower surface of the substrate SUB.

The protective film layer PF may be disposed to cover the lower surface of the substrate SUB to support and protect the substrate SUB. The protective film layer PF may be made of, for example, a polymer material such as polyethylene terephthalate, but the embodiments described herein are not limited thereto. As shown in FIG. 3, when the pad area PA is located upside down with respect to the bending area BA, a part of the protective film layer PF may be interposed between the fourth curved portion DP_S4 and the pad area PA of the display panel DP, and between the flat portion DP_F and the pad area PA of the display panel DP, to form a double layer. It should be understood that the embodiments described herein are not limited thereto.

The display device 1 may further include a driving member DDM and a printed circuit board FPCB.

The driving member DDM may be mounted on the pad area PA. The driving member DDM may be positioned between the bending area BA and the printed circuit board FPCB. The driving member DDM may include an integrated circuit for driving the display panel DP. According to an embodiment, the driving member DDM may be, for example, a display driving integrated circuit, but the embodiments described herein are not limited thereto.

The printed circuit board FPCB may be attached to the pad area PA. The printed circuit board FPCB may overlap the flat portion DP_F of the display panel DP in the thickness direction. The printed circuit board FPCB may be, buts a flexible circuit film.

As described above, the flat portion CW_F of the cover window CW may overlap the flat portion DP_F of the display panel DP, and the fourth curved portion CW_S4 of the cover window CW may overlap the fourth curved portion DP_S4 of the display panel DP in the thickness direction. The fourth curved portion CW_S4 of the cover window CW may refer to one of the curved portions CW_S of the cover window CW, which overlaps the fourth curved portion DP_S4 of the display panel DP, the bending area BA and/or the pad area PA in the thickness direction. The fourth curved portion DP_S4 of the display panel DP may refer to one of the plurality of curved portions DP_S of the display panel DP, which is connected to the bending area BA. When the bending area BA and the pad area PA are eliminated, the fourth curved portion CW_S4 of the cover window CW may be replaced with the first curved portion CW_S1, the second curved portion CW_S2 or the third curved portion CW_S3 of the cover window CW, and the fourth curved portion DP_S4 of the display panel DP may be replaced with the first curved portion DP_S1, the second curved portion DP_S2 or the third curved portion DP_S3 of the display panel DP.

The lower surface CW_F_RS of the flat portion CW_F of the cover window CW may be extended flatly in parallel to the first direction X and the second direction Y. The lower surface CW_F_RS of the flat portion CW_F of the cover window CW may be opposite to the upper surface CW_F_FS of the flat portion CW_F facing the outside. The upper surface CW_F_FS and the lower surface CW_F_RS of the flat portion CW_F of the cover window CW may be substantially parallel to each other in cross-section.

The lower surface CW_S4_RS of the fourth curved portion CW_S4 of the cover window CW may have a concave shape in cross-section. The lower surface CW_S4_RS of the fourth curved portion CW_S4 of the cover window CW may be opposite to the upper surface CW_S4_FS of the fourth curved portion CW_S4 facing the outside and having a convex shape.

The display device 1 may further include a printed layer PRT disposed on the cover window CW, a buffer layer BL on the printed layer PRT, and a code printed layer CPRL on the buffer layer BL.

The printed layer PRT may be disposed on the lower surface of the cover window CW facing the display panel DP. Specifically, the printed layer PRT may be disposed across the lower surface CW_S4_RS of the fourth curved portion CW_S4 of the cover window CW facing the display panel DP and the lower surface CW_F_RS of the flat portion CW_F of the cover window CW. A part of the printed layer PRT may overlap the fourth curved portion CW_S4 of the cover window CW in the thickness direction, and another part of the printed layer PRT may overlap the flat portion CW_F of the cover window CW in the thickness direction.

The printed layer PRT may be disposed in a shape conforming to the lower surface CW_F_RS of the flat portion CW_F and the lower surface CW_S4_RS of the fourth curved portion CW_S4 of the cover window CW. In cross section, the part of the printed layer PRT that is disposed on the lower surface of the cover window CW may be extended flatly, and the part of the printed layer PRT that is disposed on the fourth curved portion CW_S4 may be bent along the shape of the lower surface CW_S4_RS of the concave fourth curved portion CW_S4 in the downward direction.

The printed layer PRT may include a material that blocks or absorbs light. For example, the printed layer PRT may be formed by printing an organic material containing a black dye or a black pigment, or by printing an opaque metal material such as chromium. As another example, the printed layer PRT may be made of the same material as a light-blocking member employed by the display panel DP, for example, a black matrix disposed between pixels to distinguish them. The printed layer PRT may work as a light-blocking member for transmitting external light, reflecting external light, and/or blocking light of the display panel DP.

The buffer layer BL may be disposed on the printed layer PRT. The buffer layer BL may be interposed between the printed layer PRT and the code printed layer CPRL. The buffer layer BL may be disposed in the identification region C_R1 and the periphery to surround the identification region C_R1. It should be understood that the embodiments described herein are not limited thereto. The buffer layer BL may be disposed only in the identification region C_R1.

A part of the buffer layer BL may overlap the fourth curved portion CW_S4 of the cover window CW in the thickness direction, and another part of the buffer layer BL may overlap the flat portion CW_F of the cover window CW in the thickness direction. The buffer layer BL may be disposed to overlap in the thickness direction a part of the printed layer PRT, e.g., a central portion in cross section.

The buffer layer BL may be disposed to have a smaller size than that of the printed layer PRT. The size may be the length from one end to the other end of the buffer layer BL in cross section. The size may be measured on a plane. In the cross-sectional view, both ends of the buffer layer BL may be disposed more to the inside than both ends of the printed layer PRT, respectively, so that they are spaced apart from them. Accordingly, compared to a structure in which the buffer layer BL is disposed entirely on the printed layer PRT, the thickness of the display device 1 can be reduced.

A part of the buffer layer BL may be bent such that it conforms to the bent shape of the fourth curved portion CW_S4 of the cover window CW. A part of the buffer layer BL overlapping the fourth curved portion CW_S4 of the cover window CW is bent to have a curvature in the downward direction along the shape of the fourth curved portion CW_S4, while another part of the buffer layer BL overlapping the flat portion CW_F of the cover window CW may be extended flatly in the second direction Y.

As shown in FIG. 3, the size of the part of the buffer layer BL that is disposed on the fourth curved portion CW_S4 of the cover window CW may be smaller than the size of the part that is disposed on the flat portion CW_F of the cover window CW in cross section. It should be understood that the embodiments described herein are is not limited thereto. The size of the part of the buffer layer BL that is disposed on the fourth curved portion CW_S4 of the cover window CW may be equal to or greater than the size of the part that is disposed on the flat portion CW_F of the cover window CW.

The buffer layer BL may have a color substantially identical or similar to that of the printed layer PRT. The buffer layer BL may be made of a material that has a color substantially identical or similar to that of the printed layer PRT. For example, the buffer layer BL may be made of an ink composition having the same color as the printed layer PRT.

The buffer layer BL may work as a light-blocking member together with the printed layer PRT. The buffer layer BL may be included in the printed layer PRT. The printed layer PRT may be referred to as a first printed layer or a first light-blocking member, and the buffer layer BL may be referred to as a second printed layer or a second light-blocking member. It should be understood that the embodiments described herein are not limited thereto. The buffer layer BL may have a color different from that of the printed layer PRT or may be a transparent layer made of a transparent material.

The buffer layer BL may be made of a material substantially identical or similar to that of the printed layer PRT. For example, the buffer layer BL may include an organic material containing a black dye or a black pigment, or an opaque metal material such as chromium. It should be understood that the embodiments described herein are not limited thereto. The buffer layer BL may be made of a material different from that of the printed layer PRT.

When the buffer layer BL has the same color as the printed layer PRT or is transparent, a pattern formed by the plurality of grooves GP and the printed layer PRT, for example, a QR code, can be more clearly recognized.

The code printed layer CPRL may be disposed on the buffer layer BL. The code printed layer CPRL may be interposed between the transparent coupling layer OCR and the buffer layer BL. The code printed layer CPRL may be disposed in the identification region C_R1.

A part of the code printed layer CPRL may overlap the fourth curved portion CW_S4 of the cover window CW in the thickness direction, and another part of the code printed layer CPRL may overlap the flat portion CW_F of the cover window CW in the thickness direction. The code printed layer CPRL may be disposed to overlap in the thickness direction a part of the printed layer PRT, e.g., a central portion in cross section.

The code printed layer CPRL may be disposed to have a size smaller than that of the buffer layer BL. The size may be the length and/or the width from one end to the other end of the code printed layer CPRL in cross section. The size may be measured on a plane. In the cross-sectional view, both ends of the code printed layer CPRL may be disposed more to the inside than both ends of the buffer layer BL, respectively, so that they are spaced apart from them. According to an embodiment the distance by which the both ends of the code printed layer CPRL are spaced apart from the both ends of the buffer layer BL, respectively, may be smaller than the distance by which the both ends of the buffer layer BL are spaced apart from the both ends of the printed layer PRT, respectively. It should be understood that the embodiments described herein are not limited thereto. The distance by which the both ends of the code printed layer CPRL are spaced apart from the both ends of the buffer layer BL, respectively, may be equal to or greater than the distance by which the both ends of the buffer layer BL are spaced apart from the both ends of the printed layer PRT, respectively.

A part of the code printed layer CPRL may be bent such that it conforms to the curved shape of the fourth curved portion CW_S4 of the cover window CW. A part of the code printed layer CPRL overlapping the fourth curved portion CW_S4 of the cover window CW is bent to have a curvature in the downward direction along the shape of the fourth curved portion CW_S4, while another part of the code printed layer CPRL overlapping the flat portion CW_F of the cover window CW may be extended flatly in the second direction Y.

As shown in FIG. 3, the size of the part of the code printed layer CPRL that is disposed on the fourth curved portion CW_S4 of the cover window CW may be smaller than the size of the part that is disposed on the flat portion CW_F of the cover window CW in cross section. It should be understood that the embodiments described herein are not limited thereto. The size of the part of the code printed layer CPRL that is disposed on the fourth curved portion CW_S4 of the cover window CW may be equal to or greater than the size of the part that is disposed on the flat portion CW_F of the cover window CW.

The code printed layer CPRL may have a color different from that of the printed layer PRT. The code printed layer CPRL may have a hue, a brightness and/or a chroma different from those of the printed layer PRT. The code printed layer CPRL may have a color having a relatively large hue contrast, brightness contrast, and/or chroma contrast relative to the printed layer PRT. The code printed layer CPRL may have a color having the hue contrast, lightness contrast and/or chroma contrast relative to the printed layer PRT greater than those of the elements near the printed layer PRT, e.g., the cover window CW, the buffer layer BL, and/or a stage on which the cover window CW is mounted. Accordingly, the pattern formed in the code printed layer CPRL and the plurality of grooves GP can be more easily recognized. For example, when the printed layer PRT is black, the code printed layer CPRL may be white, but the embodiments described herein are not limited thereto.

The code printed layer CPRL may have a color different from that of the buffer layer BL. The code printed layer CPRL may have a hue, a brightness and/or a chroma different from those of the buffer layer BL. The code printed layer CPRL may have a color having a relatively large hue contrast, brightness contrast, and/or chroma contrast relative to the printed layer PRT. According to an embodiment, the color of the buffer layer BL may be identical to the color of the printed layer PRT, and the color of the code printed layer CPRL may be different from the color of the buffer layer BL and the printing layer PRT. In this instance, the hue contrast, the brightness contrast and/or the chroma contrast between the buffer layer BL and the printed layer PRT may be approximately zero. For example, the buffer layer BL and the printed layer PRT may be black, while the code printed layer CPRL may be white. It should be understood that the embodiments described herein are not limited thereto. The buffer layer BL, the printed layer PRT and the code printed layer CPRL may have different colors. In such case, the color contrast, brightness contrast and/or chroma contrast between the buffer layer BL and the printed layer PRT may be smaller than those of the buffer layer BL and the code printed layer CPRL. Alternatively, the buffer layer BL may be a transparent layer.

According to an embodiment, the printed layer PRT, the buffer layer BL and the code printed layer CPRL may have different thicknesses. The thickness of the printed layer PRT may be greater than that of the code printed layer CPRL. The thickness of the buffer layer BL may be smaller than that of the printed layer PRT and larger than the code printed layer CPRL. Accordingly, while light passing through the printed layer PRT can be appropriately blocked, a sufficient depth for forming the plurality of grooves GP can be obtained. As a result, the overall thickness of the display device 1 can be reduced. For example, the thickness of the printed layer PRT may be approximately 2 mm, the thickness of the code printed layer CPRL may be approximately 1.2 mm, and the thickness of the buffer layer BL may be approximately greater than 1.2 mm and less than 2 mm. It should be understood that the embodiments described herein are not limited thereto. the printed layer PRT, the buffer layer BL and the code printed layer CPRL may have substantially the same thickness, or the thickness of the code printed layer CPRL may be greater than that of the printed layer PRT.

Figure 4:
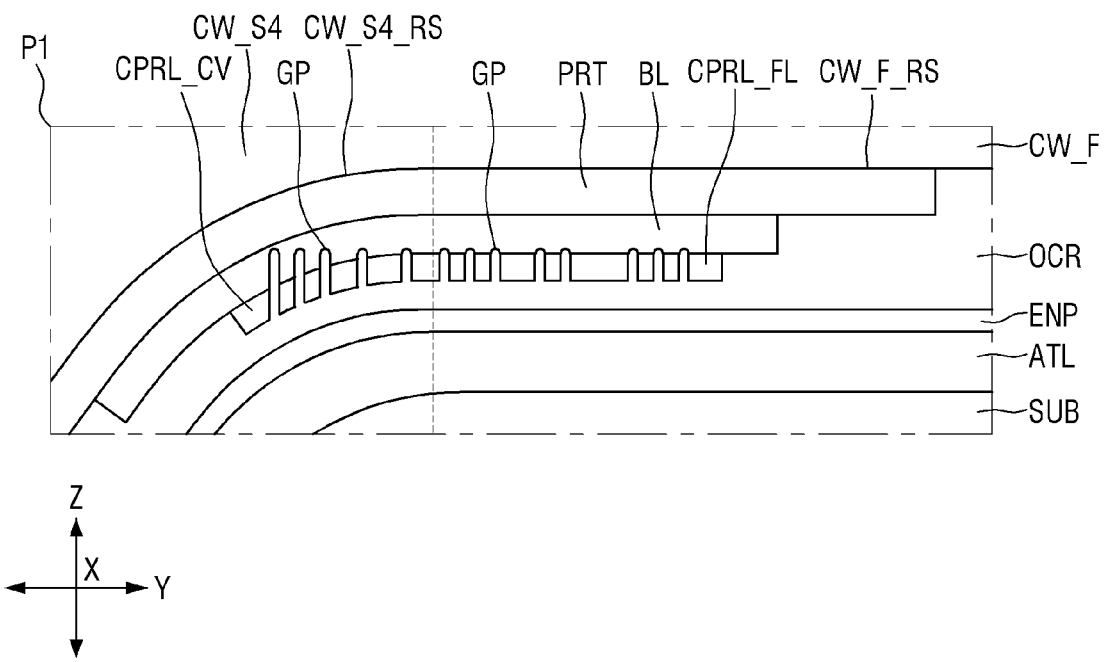
FIG. 4 is an enlarged cross-sectional view of portion P1 of FIG. 3.
Figure 5:
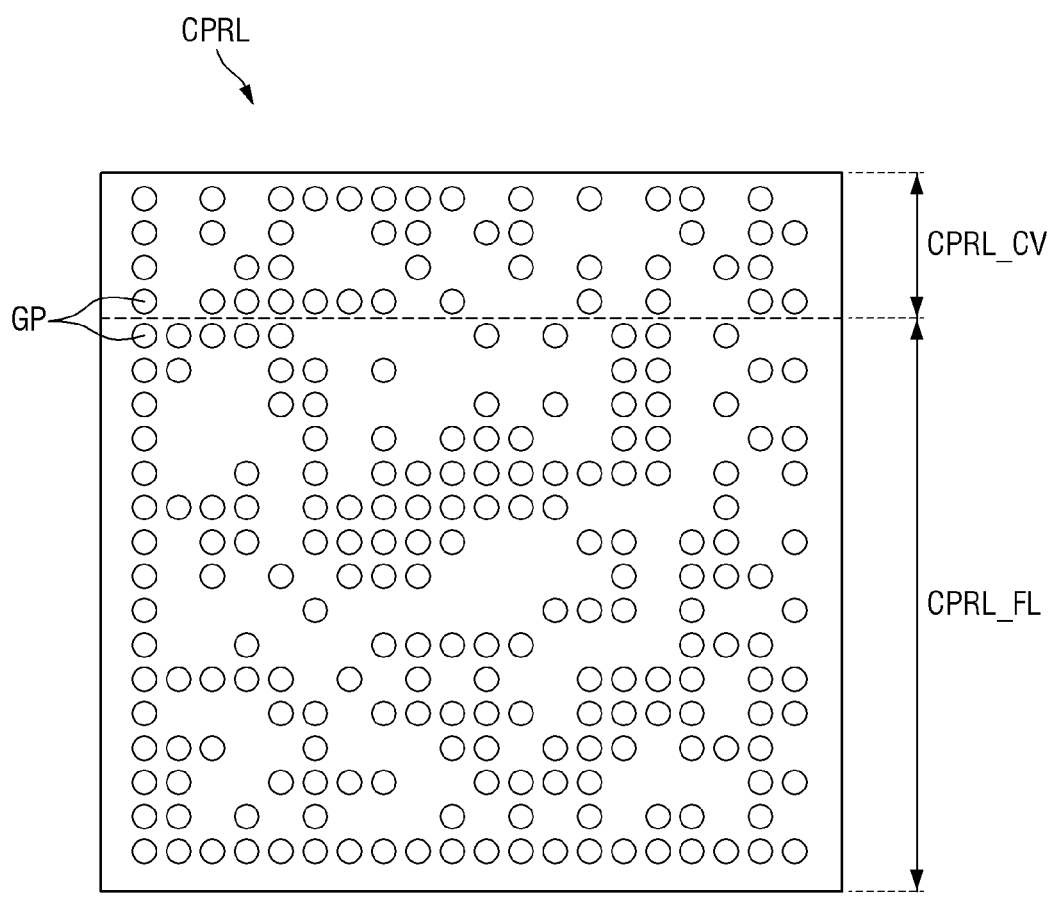
FIG. 5 is a plan view of a code printed layer according to an embodiment.

Referring to FIGS. 3 and 4, the display device 1 may further include a plurality of grooves GP formed in the code printed layer CPRL.

The plurality of grooves GP may be located in the identification region C_R1. Some of the grooves GP may overlap the fourth curved portion CW_S4 of the cover window CW in the thickness direction, and some others may overlap the flat portion CW_F of the cover window CW in the thickness direction.

The plurality of grooves GP may be recessed toward the upper side (front side) where images are displayed and toward the cover window CW from the lower surface of the code printed layer CPRL facing the display panel DP in cross section. The upward direction may be generally perpendicular to the upper surface CW_F_FS and/or the lower surface CW_F_RS of the flat portion CW_F of the cover window CW. As the code printed layer CPRL has a curvature, some of the grooves GP that overlap the flat portion CW_F of the cover window CW are recessed in a direction perpendicular to the lower surface of the code printed layer CPRL, while the others of the grooves GP that overlap the fourth curved portion CW_S4 of the cover window CW may be recessed in a direction inclined with respect to the lower surface of the code printed layer CPRL. As shown in FIG. 3, the grooves GP may be recessed in the same direction regardless of the curvature of the cover window CW. Accordingly, the pattern formed by the plurality of grooves GP during the process of fabricating the display device 1 can be more clearly recognized by a vision camera or the like.

According to an embodiment, the plurality of grooves GP may completely penetrate through the code printed layer CPRL, but may penetrate only a part of the buffer layer BL. In other words, the plurality of grooves GP may not completely penetrate through the buffer layer BL. The ends of the plurality of grooves GP may be located on the lower surface of the buffer layer BL on which the code printed layer CPRL is disposed and/or inside the buffer layer BL. Accordingly, as shown in FIG. 3, irregularities may be formed on the lower surface of the buffer layer BL.

At least some of the plurality of grooves GP may penetrate the code printed layer CPRL and the buffer layer BL at different depths. The depth may be measured from the lower surface of the code printed layer CPRL facing the display panel DP. The depth of some of the grooves GP which overlap the fourth curved portion CW_S4 of the cover window CW may be larger than the depth of the others of the grooves GP which overlap the flat portion CW_F of the cover window CW. As shown in FIG. 3, the depths of some of the grooves GP that overlap the flat portion CW_F of the cover window CW may be constant, but the depths of the others of the grooves GP that overlap the fourth curved portion CW_S4 of the cover window CW may increase toward the end of the fourth curved portion CW_S4. In such case, the ends of the plurality of grooves GP may be aligned with respect to an imaginary horizontal line in cross section. It should be understood that the embodiments described herein are not limited thereto. All of the plurality of grooves GP may have a uniform depth.

At least some of the plurality of grooves GP, e.g., the grooves GP overlapping the fourth curved portion CW_S4 of the cover window CW may further penetrate the buffer layer BL. In such case, the ends of the grooves GP penetrating through the buffer layer BL may be located on the lower surface of the printed layer PRT and/or inside the printed layer PRT.

Referring further to FIG. 5, when the code printed layer CPRL is expanded on a plane, it may have a generally square shape. It should be understood that the embodiments described herein are not limited thereto. The code printed layer CPRL may have a variety of shapes such as a polygon, a circle and an oval.

Each of the plurality of grooves GP may have a circular shape and/or a dot shape when viewed from the top. It should be understood that the embodiments described herein are not limited thereto. Each of the plurality of grooves GP may have a variety of shapes, such as a rectangular shape, a square shape, a polygonal shape, an oval shape, a lattice shape, a cross shape and a stripe shape when viewed from the top.

The plurality of grooves GP may form a pattern when viewed from the top. The pattern may be, for example, a QR code, but the embodiments described herein are not limited thereto. As the buffer layer BL and/or the printed layer PRT having a color different from that of the code printed layer CPRL is exposed through the plurality of grooves GP, the pattern can be more clearly recognized.

When the edge of the cover window CW is bent to have a curvature, it is difficult to have a uniform shape, and it is difficult to form the code printed layer CPRL on the cover window CW with a uniform thickness. According to the embodiment, the display device 1 includes the buffer layer BL to compensate for a thickness deviation of the printed layer PRT and/or the code printed layer CPRL that may occur during the process, and to obtain a sufficient thickness for forming the plurality of grooves GP irrespectively of the curved shape of the cover window CW. As a result, it is possible to clearly recognize the pattern of the identification region C_R1, and it is possible to prevent the pattern from being recognized from the outside.

Figure 6:
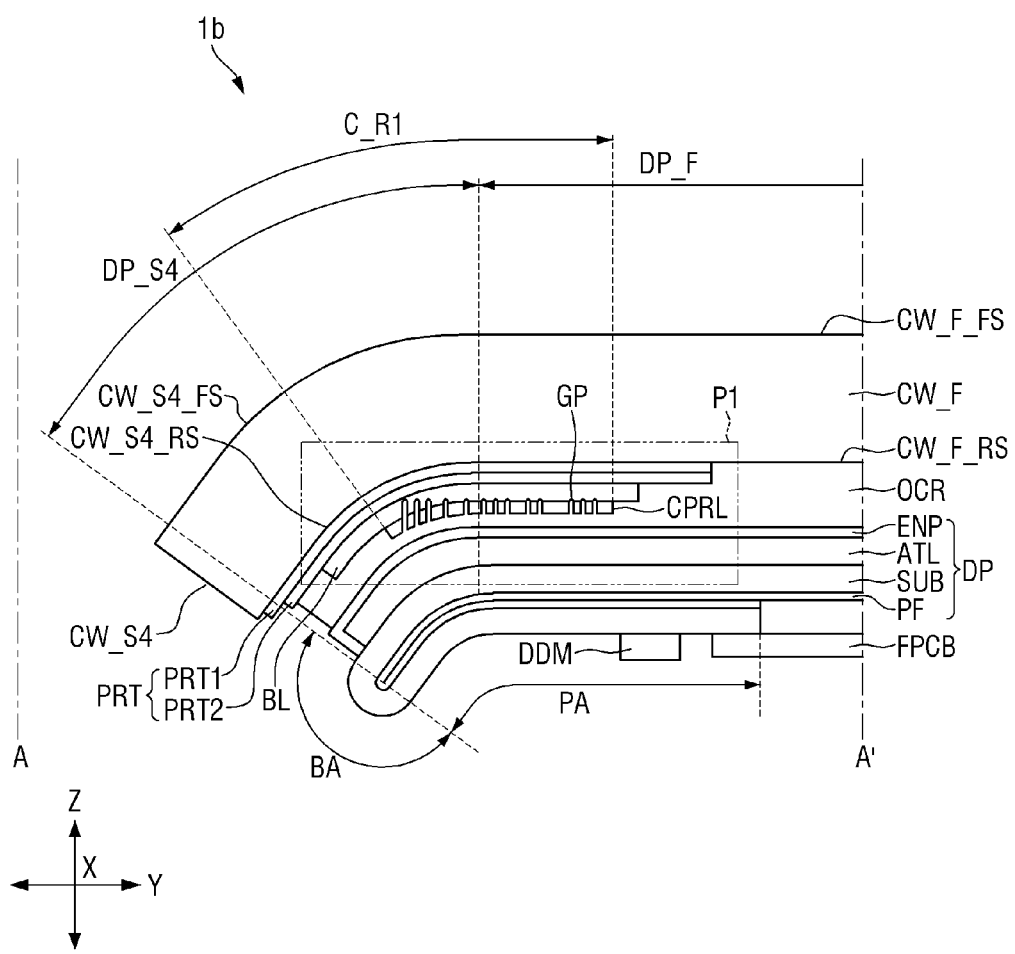
FIG. 6 is a cross-sectional view of a display device according to another embodiment.

FIG. 6 is a cross-sectional view of a display device according to another embodiment.

The embodiment of FIG. 6 is different from the embodiment of FIGS. 1 to 5 in that a printed layer PRT is made up of multiple layers.

Referring to FIG. 6, the printed layer PRT may include a first printed layer PRT1 and a second printed layer PRT2.

The first printed layer PRT1 may be disposed on a lower surface CW_S4_RS of a fourth curved portion CW_S4 and a lower surface of a flat portion CW_F of a cover window CW. The first printed layer PRT1 may be interposed between the cover window CW and the second printed layer PRT2.

The first printed layer PRT1 may be disposed in a shape conforming to the lower surface CW_F_RS of the flat portion CW_F and the lower surface CW_S4_RS of the fourth curved portion CW_S4 of the cover window CW. In cross section, the part of the first printed layer PRT1 that is disposed on the lower surface of the cover window CW may be extended flatly, and the part of the first printed layer PRT1 that is disposed on the fourth curved portion CW_S4 may be bent along the shape of the lower surface CW_S4_RS of the concave fourth curved portion CW_S4 in the downward direction.

The second printed layer PRT2 may be disposed on the first printed layer PRT1. The second printed layer PRT2 may be interposed between the transparent coupling layer OCR and the first printed layer PRT1 and between the buffer layer BL and the first printed layer PRT1.

The second printed layer PRT2 may also be disposed to have a cross-sectional shape substantially identical or similar to that of the first printed layer PRT1 depending on the shape of the cover window CW.

The first printed layer PRT1 and the second printed layer PRT2 may have substantially the same thickness. For example, each of the first printed layer PRT1 and the second printed layer PRT2 may have a thickness of approximately 1 mm. It should be understood that the embodiments described herein are not limited thereto. The first printed layer PRT1 and the second printed layer PRT2 may have different thicknesses.

The first printed layer PRT1 and the second printed layer PRT2 may be made of substantially the same material. The first printed layer PRT1 and the second printed layer PRT2 may include a material that blocks or absorbs light. The first printed layer PRT1 and the second printed layer PRT2 may be formed by, for example, printing an organic material containing black dye or black pigment, or an opaque metal material such as chromium. It should be understood that the embodiments described herein are not limited thereto. The first printed layer PRT1 and the second printed layer PRT2 may be made of different thicknesses.

The first printed layer PRT1 may serve to prevent transmission and reflection of external light, and the second printed layer PRT2 may serve to prevent light emitted from the display panel DP from exiting to the outside. It should be understood that the embodiments described herein are not limited thereto.

In the cross-sectional view, the end of the first printed layer PRT1 and the end of the second printed layer PRT2 adjacent to the edge of the fourth curved portion CW_S4 of the cover window CW may be spaced apart from the edge of the fourth curved portion CW_S4 inward in a direction intersecting the thickness direction. The direction intersecting the thickness direction from the edge may refer to a direction in which the lower surface CW_S4_RS of the fourth curved portion CW_S4 is extended. In such case, the distance by which the end of the second printed layer PRT2 is spaced apart from the edge of the fourth curved portion CW_S4 may be greater than the distance by which the end of the first printed layer PRT1 is spaced apart from the edge of the fourth curved portion CW_S4. That is to say, the end of the second printed layer PRT2 may not be aligned with the end of the first printed layer PRT1 in the thickness direction but may be more to the inside than and spaced apart from it. It should be understood that the embodiments described herein are not limited thereto. The end of the first printed layer PRT1, the end of the second printed layer PRT2 and/or the edge of the fourth curved portion CW_S4 may be aligned with one another in the thickness direction.

The buffer layer BL may be disposed on the second printed layer PRT2. As described above, the part of the buffer layer BL overlapping the fourth curved portion CW_S4 of the cover window CW may also be bent along the curved shape of the cover window CW.

The end of the buffer layer BL overlapping the fourth curved portion CW_S4 of the cover window CW may be disposed more to the inside than and spaced apart from the end of the second printed layer PRT2. In such case, the distance by which the end of the buffer layer BL is spaced apart from the end of the second printed layer may be greater than the distance by which the end of the second printed layer PRT2 is spaced apart from the end of the first printed layer PRT1. It should be understood that the embodiments described herein are not limited thereto.

As shown in FIG. 6, the ends of the plurality of grooves GP may be located in the buffer layer BL. It should be understood that the embodiments described herein are not limited thereto. At least some of the ends of the plurality of grooves GP may be located in the second printed layer PRT2 or in the first printed layer PRT1.

Although the printed layer PRT is made up of two layers in the example shown in FIG. 6, the number of the layers is not limited thereto. The printed layer PRT may be made up of three or more layers.

The embodiment of FIG. 6 is substantially identical to the embodiment of FIGS. 1 to 5 except that the printed layer PRT is made up of multiple layers; and, therefore, the redundant descriptions will be omitted for ease in explanation of this embodiment.

Figure 7:
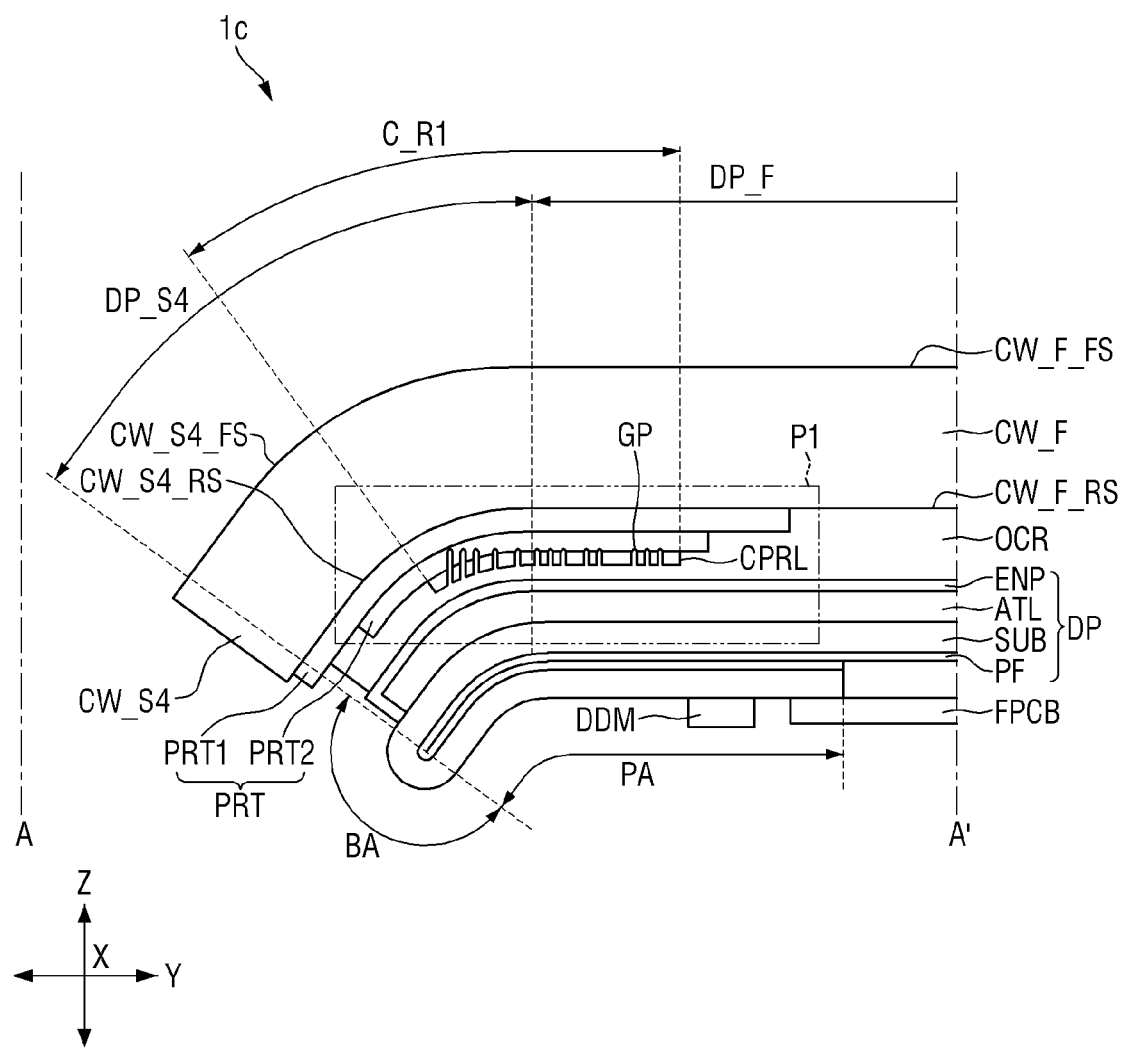
FIG. 7 is a cross-sectional view of a display device according to yet another embodiment.

FIG. 7 is a cross-sectional view of a display device according to yet another embodiment.

The embodiment of FIG. 7 is different from the embodiment of FIG. 6 in that a second printed layer PRT2 is disposed in place of a buffer layer BL.

Referring to FIG. 7, the printed layer PRT may include a first printed layer PRT1 and a second printed layer PRT2.

The first printed layer PRT1 is substantially identical to the printed layer of FIG. 3 or the first printed layer PRT1 of FIG. 6; and, therefore, the redundant descriptions will be omitted for ease in explanation of the embodiment.

The second printed layer PRT2 may be disposed on the first printed layer PRT1. The second printed layer PRT2 may be interposed between the first printed layer PRT1 and the code printed layer CPRL. The second printed layer PRT2 may be in direct contact with the first printed layer PRT1 and the code printed layer CPRL.

The second printed layer PRT2 may be disposed in the identification region C_R1 and the periphery to surround the identification region C_R1. It should be understood that the embodiments described herein are not limited thereto. The second printed layer PRT2 may be disposed only in the identification region C_R1.

The second printed layer PRT2 may have a size and a shape substantially the same as or similar to those of the buffer layer BL shown in FIGS. 3, 4 and 6.

The second printed layer PRT2 may have a size smaller than that of the first printed layer PRT1. The length from one end to the other end of the second printed layer PRT2 may be smaller than the length from one end to the other end of the first printed layer PRT1 in cross section. In the cross-sectional view, the both ends of the code printed layer CPRL may be disposed more to the inside than the both ends of the first printed layer PRT1, respectively, so that they are spaced apart from them. In a cross-sectional view, the both ends of the second printed layer PRT2 may be disposed on one surface (lower surface) of the first printed layer PRT1 facing the display panel.

The second printed layer PRT2 may be disposed to have a size larger than that of the code printed layer CPRL. The length from one end to the other end of the second printed layer PRT2 may be larger than the length from one end to the other end of the code printed layer CPRL in cross section. In the cross-sectional view, the both ends of the second printed layer PRT2 may be disposed more to the outside than the both ends of the code printed layer CPRL, respectively, so that they are spaced apart from them. In the cross-sectional view, the both ends of the code printed layer CPRL may be disposed on one surface (lower surface) of the second printed layer PRT2 facing the display panel. It should be understood that the embodiments described herein are not limited thereto. In cross section, the both ends of the second printed layer PRT2 may be aligned with the both ends of the code printed layer CPRL, respectively.

A part of the second printed layer PRT2 may be bent such that it conforms to the curved shape of the fourth curved portion CW_S4 of the cover window CW. A part of the second printed layer PRT2 overlapping the fourth curved portion CW_S4 of the cover window CW is bent to have a curvature in the downward direction along the shape of the fourth curved portion CW_S4, while another part of the second printed layer PRT2 overlapping the flat portion CW_F of the cover window CW may be extended flatly in the second direction Y.

The plurality of grooves GP may completely penetrate through the code printed layer CPRL, but may penetrate only a part of the second printed layer PRT2. In other words, the plurality of grooves GP may not completely penetrate through the second printed layer PRT2. The ends of the plurality of grooves GP may be located on the lower surface of the second printed layer PRT2 on which the code printed layer CPRL is disposed and/or inside the second printed layer PRT2. Accordingly, as shown in FIG. 3, irregularities may be formed on the lower surface of the second printed layer PRT2.

At least some of the plurality of grooves GP may penetrate the code printed layer CPRL and the second printed layer PRT2 at different depths. The depth may be measured from the lower surface of the code printed layer CPRL facing the display panel DP. The depth of some of the grooves GP which overlap the fourth curved portion CW_S4 of the cover window CW may be larger than the depth of the others of the grooves GP which overlap the flat portion CW_F of the cover window CW.

As shown in FIG. 7, the depths of some of the grooves GP that overlap the flat portion CW_F of the cover window CW may be constant, but the depths of the others of the grooves GP that overlap the fourth curved portion CW_S4 of the cover window CW may increase toward the end of the fourth curved portion CW_S4. In such case, the ends of the plurality of grooves GP may be aligned with respect to an imaginary horizontal line in cross section. It should be understood that embodiments described herein are not limited thereto. All of the plurality of grooves GP may have a uniform depth.

At least some of the plurality of grooves GP, e.g., the grooves GP overlapping the fourth curved portion CW_S4 of the cover window CW may further penetrate the second printed layer PRT2. In such case, the ends of the grooves GP penetrating through the second printed layer PRT2 may be located on the lower surface of the first printed layer PRT1 and/or inside the first printed layer PRT1.

The first printed layer PRT1 and the second printed layer PRT2 may be made of substantially the same material. The first printed layer PRT1 and the second printed layer PRT2 may include a material that blocks or absorbs light. The first printed layer PRT1 and the second printed layer PRT2 may be formed by, for example, printing an organic material containing black dye or black pigment, or an opaque metal material such as chromium. It should be understood that the embodiments described herein are not limited thereto. The first printed layer PRT1 and the second printed layer PRT2 may be made of different thicknesses.

Although each of the first printed layer PRT1 and the second printed layer PRT2 is implemented as a single layer in the example shown in FIG. 7, the embodiments described herein are not limited thereto. The first printed layer PRT1 or the second printed layer PRT2 may be made up of multiple layers.

The embodiment of FIG. 7 is substantially identical to the embodiment of FIG. 6 except that the second printed layer PRT2 is disposed in place of the buffer layer BL; and, therefore, the redundant descriptions will be omitted for ease in explanation of the embodiment.

Figure 8:
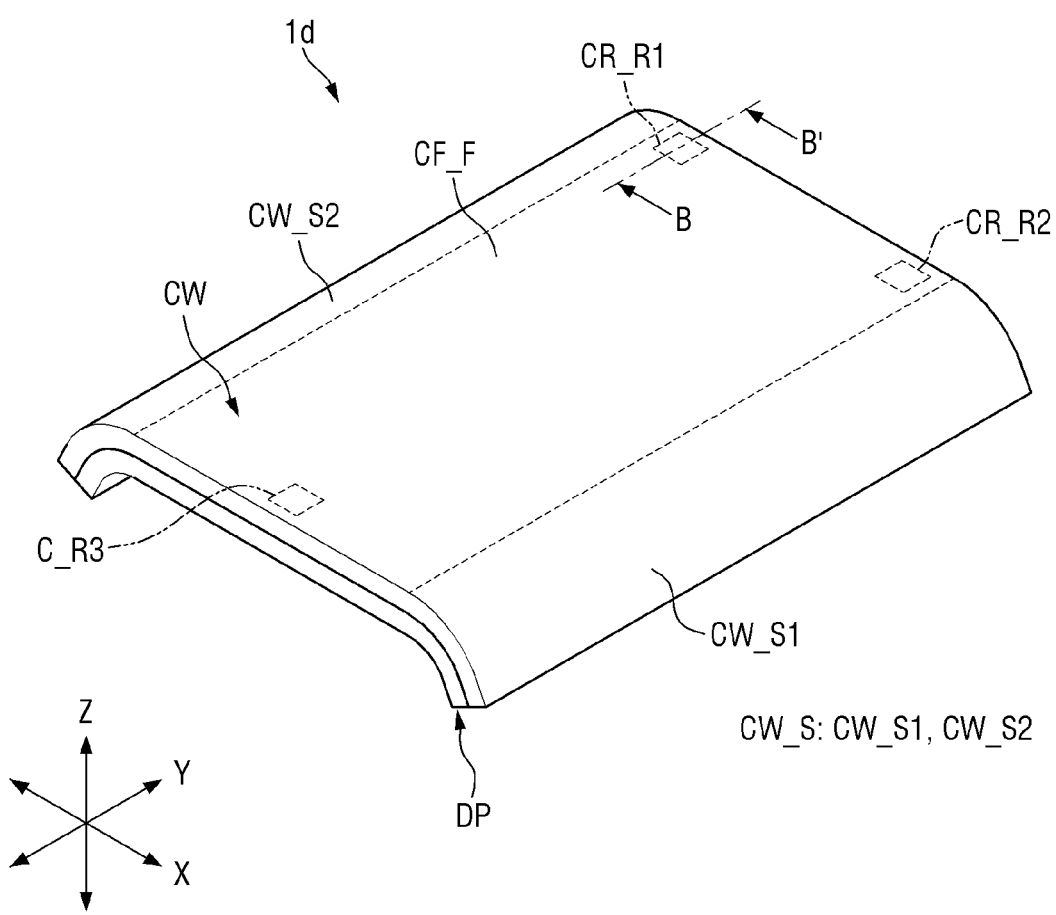
FIG. 8 is a perspective view of a display device according to yet another embodiment.
Figure 9:
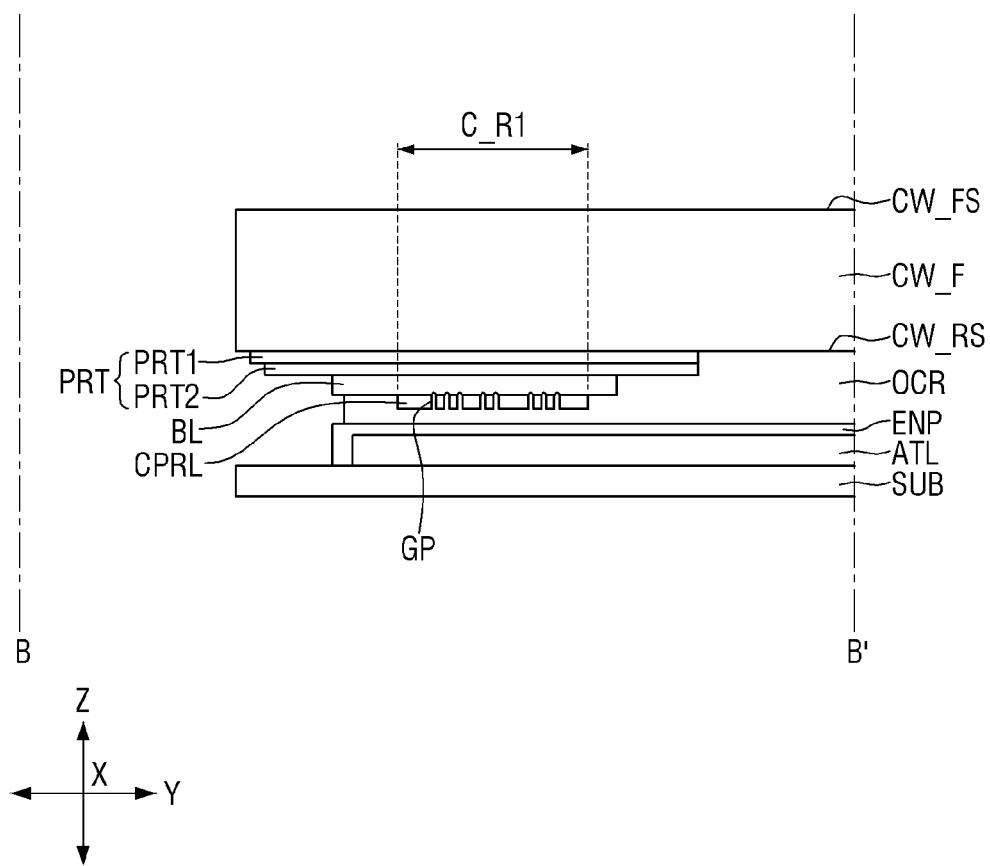
FIG. 9 is a cross-sectional view taken along line B-B' of FIG. 8.

FIG. 8 is a perspective view of a display device according to yet another embodiment. FIG. 9 is a cross-sectional view taken along line B-B' of FIG. 8.

The embodiment of FIGS. 8 and 9 is different from the embodiment of FIGS. 1 to 5 in the shape of a display device 1c and the arrangement of an identification region C_R1.

Referring to FIG. 8, as described above, the display device 1c may include a cover window CW and a display panel DP.

A first curved portion CW_S1 and a second curved portion CW_S2 of the cover window CW may be disposed on two longer sides of a flat portion CW_F of the cover window CW extended in the second direction Y, respectively. Unlike the embodiment of FIGS. 1 to 5, the third curved portion CW_S3 of the cover window CW, the fourth curved portion CW_S4 of the cover window CW, the third curved portion DP_S3 of the display panel DP, the fourth curved portion DP_S4 of the display panel DP may be eliminated.

A plurality of identification regions C_R1 may be located to overlap the flat portion CW_F of the cover window CW. The plurality of identification regions C_R1 may be disposed adjacent to two shorter sides of the flat portion CW_F of the cover window CW extended in the first direction X. For example, in the perspective view of FIG. 8, a first identification region C_R1 may be disposed on one shorter side of the flat portion DP_F located at the lower left side, and a second identification region C_R2 and a third identification region C_R3 may be disposed on the other shorter side of the flat portion DP_F located at the upper right side. It should be noted that the position and number of the plurality of identification regions C_R1 are not limited thereto, but may be variously altered depending on the design of the display device 1. At least one of the first identification region C_R1, the second identification region C_R2 and the third identification region C_R3 may be eliminated.

The identification region C_R1 disposed adjacent to one shorter side of the flat portion DP_F may perform a different function from the identification region C_R1 disposed adjacent to the other shorter side of the flat portion DP_F. For example, a pattern for recognizing the cover window CW, for example, a QR code, may be disposed in the first identification region C_R1, and patterns for aligning the display panel DP with the cover window CW during the process of attaching them, for example, alignment marks, may be respectively disposed in the second identification region C_R2 and the third identification region C_R3. As described above, the pattern may be formed by the plurality of grooves GP formed in the code printed layer CPRL.

Referring to FIGS. 8 and 9, the flat portion CW_F of the cover window CW and the display panel DP may be disposed to face each other, and may be coupled with each other by a transparent coupling layer OCR interposed therebetween.

The first printed layer PRT1 and the second printed layer PRT2 may be disposed on the lower surface CW_F_RS of the flat portion CW_F of the cover window CW. The first printed layer PRT1 and the second printed layer PRT2 may be extended flatly in the second direction Y along the shape of the lower surface CW_F_RS of the flat portion CW_F of the cover window CW in cross section. Although not shown in the drawings, the printed layer PRT may be made up of three or more layers or a single layer.

The end of the first printed layer PRT1 adjacent to the edge of the flat portion CW_F of the cover window CW may be disposed more to the inside than and spaced apart from the edge of the flat portion CW_F of the cover window CW. The end of the second printed layer PRT2 may be disposed more to the inside than and spaced apart from the end of the first printed layer PRT1. It should be understood that the embodiments described herein are not limited thereto. The edge of the flat portion CW_F of the cover window CW, the end of the first printed layer PRT1 and/or the end of the second printed layer PRT2 may be aligned with one another in the thickness direction.

The buffer layer BL may be disposed on the second printed layer PRT2. The buffer layer BL may be disposed to have a smaller size than that of the second printed layer PRT2. The size may refer to the width (length) in cross section or the area when viewed from the top. For example, the width of the buffer layer BL may be smaller than that of the second printed layer PRT2 in cross section. For another example, the length between both ends of the buffer layer BL may be smaller than the length between both ends of the second printed layer PRT2 in cross section.

A part of the buffer layer BL adjacent to the edge of the flat portion CW_F of the cover window CW may be disposed more to the inside than and spaced apart from the end of the second printed layer PRT2 adjacent to the edge of the flat portion CW_F of the cover window CW. In such case, the distance by which the end of the buffer layer BL is spaced apart from the end of the second printed layer PRT2 may be greater than the distance by which the end of the second printed layer PRT2 is spaced apart from the end of the first printed layer PRT1. As a result, the overall thickness of the display device 1 can be reduced.

As described above, the buffer layer BL may be made of substantially the same material as that of the printed layer PRT. All of the first printed layer PRT1, the second printed layer PRT2 and the buffer layer BL may include a material that blocks or absorbs light. For example, in the first printed layer PRT1, the second printed layer PRT2 and the buffer layer BL, the light-blocking material may include at least one of an organic material containing a black dye or a black pigment, and an opaque metal material.

The buffer layer BL may be included in the printed layer PRT. The buffer layer BL may also be referred to as a third printed layer PRT. The first printed layer PRT1, the second printed layer PRT2 and the buffer layer BL may work as a light-blocking member. The first printed layer PRT1, the second printed layer PRT2 and the buffer layer BL may be referred to as a first light-blocking member, a second light-blocking member and a third light-blocking member, respectively. It should be understood that the embodiments described herein are is not limited thereto. As described above, the buffer layer BL may be made of a material having a color different from that of the printed layer PRT or may be a transparent layer.

The code printed layer CPRL may be disposed on the buffer layer BL. The code printed layer CPRL may be formed to have a size smaller than that of the buffer layer BL. The size may be measured on a plane. For example, the width of the code printed layer CPRL may be smaller than that of the buffer layer BL in cross section.

The plurality of grooves GP may be recessed from the lower surface of the code printed layer CPRL that faces the display panel DP toward the cover window CW. Unlike the embodiment of FIGS. 1 to 5, the plurality of grooves GP may have a constant depth, but the embodiments described herein are not limited thereto.

The plurality of grooves GP may be formed to penetrate through the code printed layer CPRL. The ends of the plurality of grooves GP may be located in the buffer layer BL. Irregularities may be formed on the lower surface of the buffer layer BL facing the code printed layer CPRL. It should be understood that the embodiments described herein are not limited thereto. The plurality of grooves GP may be disposed to further penetrate the buffer layer BL, and the ends of the plurality of grooves GP may be located either in the second printed layer PRT2 or the first printed layer PRT1.

The plurality of grooves GP may be disposed to form a variety of patterns. As described above, the plurality of grooves GP may be disposed to work as a QR code for identifying the cover window CW during the process of fabricating the display device 1, and may be disposed to work as an alignment mark for aligning the cover window CW. When the plurality of grooves GP works as an alignment mark, the plurality of grooves GP may be precisely formed by laser etching, thereby improving alignment accuracy.

The embodiment of FIGS. 8 and 9 is substantially identical to the embodiment of FIGS. 1 to 5 except the shape of the display device 1c and the arrangement of the identification region C_R1; and, therefore, the redundant descriptions will be omitted for ease in explanation of the embodiment.

Figure 10:
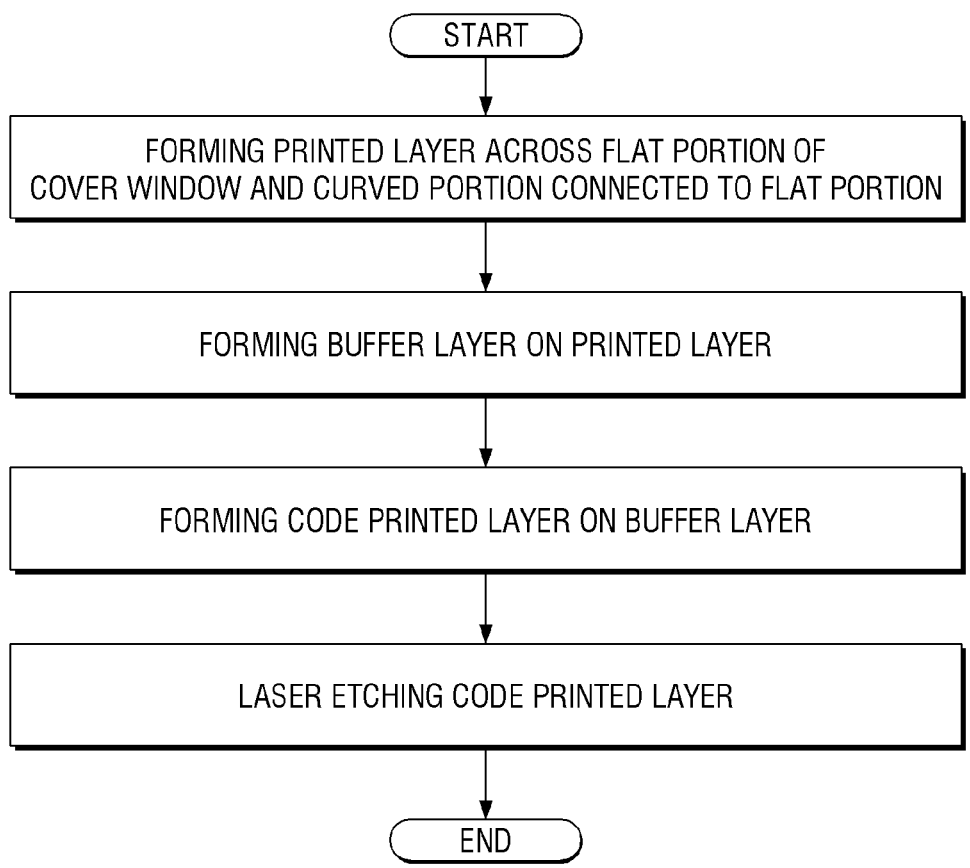
FIG. 10 is a flowchart for illustrating a method for fabricating a display device according to an embodiment.

FIG. 10 is a flowchart for illustrating a method for fabricating a display device according to an embodiment. FIGS. 11 to 15 are views showing processing steps of a method of fabricating a display device according to an embodiment.

Referring to FIG. 10, the method of fabricating a display device may include forming a printed layer PRT across a flat portion CW_F of a cover window CW and a curved portion CW_S connected to the flat portion CW_F; forming a buffer layer BL on the printed layer PRT; forming a code printed layer CPRL on the buffer layer BLOCK; and laser etching the code printed layer CPRL.

The method of fabricating a display device is not limited to the above-described embodiment, and at least some of the above steps may be omitted, or one or more steps may be added according to other embodiments.

Hereinafter, a method of fabricating a display device will be described in detail with reference to FIGS. 11 to 15. In FIGS. 11 to 15, the cover window CW is depicted upside down.

Figure 11:
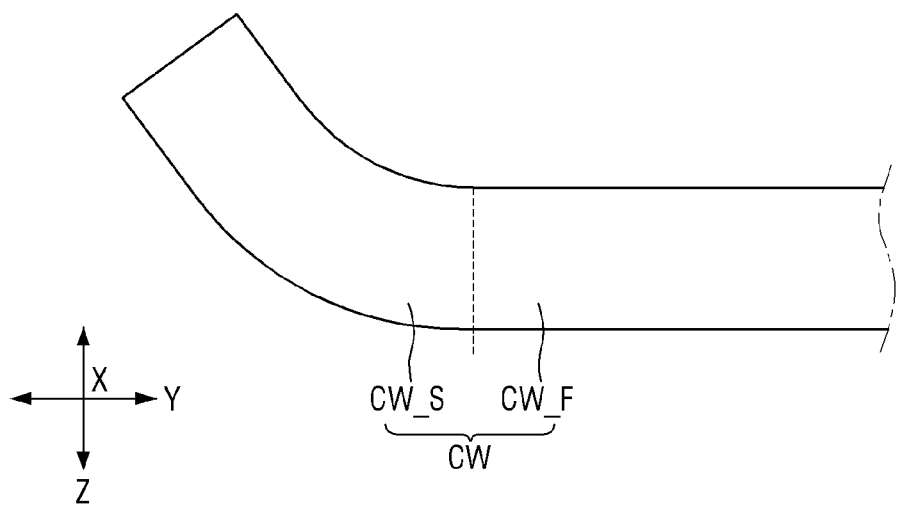
FIGS. 11, 12, 13, 14, and 15 are views showing processing steps of a method of fabricating a display device according to an embodiment.

Referring to FIG. 11, a cover window CW may be prepared. The cover window CW may refer to a window member made of a transparent material, for example, glass or quartz.

The cover window CW may have a flat portion CW_F and at least one curved portion CW_S. For example, the cover window CW may have four curved portions CW_S as shown in FIGS. 1 and 2. As another example, the cover window CW may have two curved portions CW_S as shown in FIG. 8. However, the number of the curved portions CW_S and the shape of the cover window CW are not limited thereto. Hereinafter, the curved portion CW_S of the cover window CW may be one of the first curved portion CW_S1, the second curved portion CW_S2, the third curved portion CW_S3 and the fourth curved portion CW_S4 shown in FIGS. 1 to 9. For example, the curved portion CW_S of the cover window CW may be, but is not limited to, the fourth curved portion CW_S4.

Figure 12:
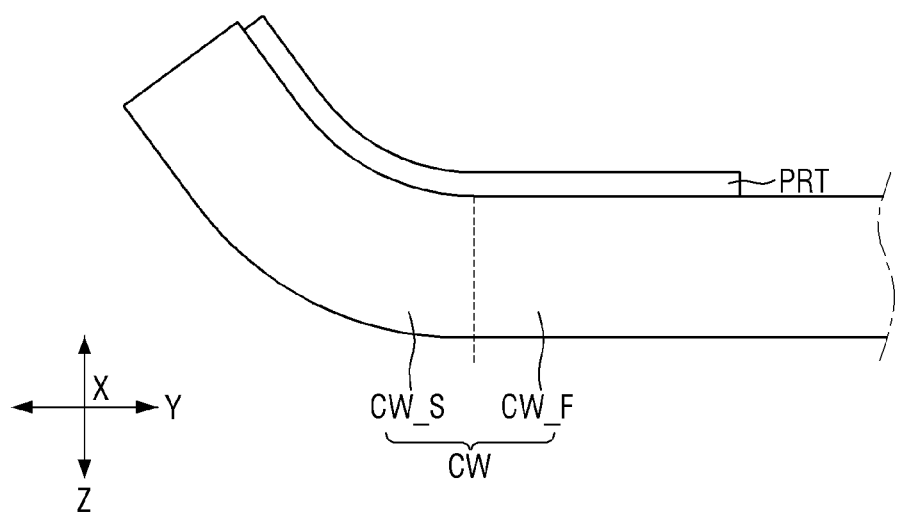

Referring to FIG. 12, a printed layer PRT may be formed on the cover window CW. The printed layer PRT may be formed across the lower surface of the concave curved portion CW_S and the lower surface of the flat portion DP_F connected thereto. The arrangement and shape of the printed layer PRT have been described above with reference to FIGS. 3 to 5. The printed layer PRT may be formed, but is not limited to, via a silk screen printing process or a pad printing process, etc.

Referring further to FIG. 6, the printed layer PRT may be made up of multiple layers. For example, after the first printed layer PRT1 is formed on the cover window CW, the second printed layer PRT2 may be formed on the first printed layer PRT1. The arrangement and shape of the first printed layer PRT1 and the second printed layer PRT2 have been described above with reference to FIG. 6.

Figure 13:
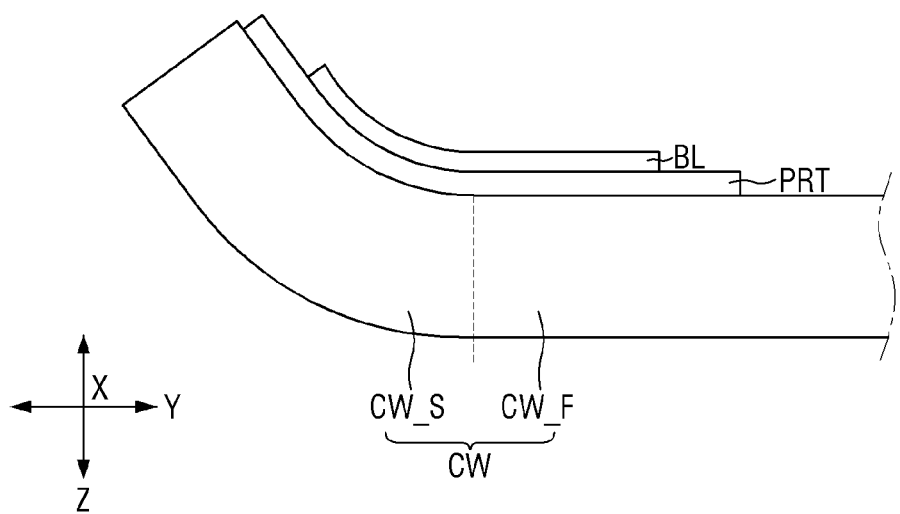

Subsequently, referring to FIG. 13, a buffer layer BL may be formed on the printed layer PRT. The buffer layer BL may be disposed to have a smaller size than that of the printed layer PRT. In cross section, the buffer layer BL may be formed to have a width smaller than that of the printed layer PRT. The buffer layer BL may be formed to have a thickness equal to or less than that of the printed layer PRT. It should be understood that the embodiments described herein are not limited thereto. The buffer layer BL may be formed to have substantially the same size and/or thickness as the printed layer PRT. Similar to the printed layer PRT, the buffer layer BL may be formed to be partially bent along the curvature of the cover window CW in cross section. The arrangement and shape of the buffer layer BL have been described above with reference to FIGS. 3 to 5.

The buffer layer BL may be formed in a manner substantially identical or similar to that of the printed layer PRT. The buffer layer BL may be formed via the same printing process as the printed layer PRT. For example, the buffer layer BL may be formed via a silk screen printing process or a pad printing process, etc. In this instance, the buffer layer BL may be formed by curing an acrylic and/or epoxy ink composition having the same color as the printed layer PRT, but the embodiments described herein are not limited thereto.

Figure 14:
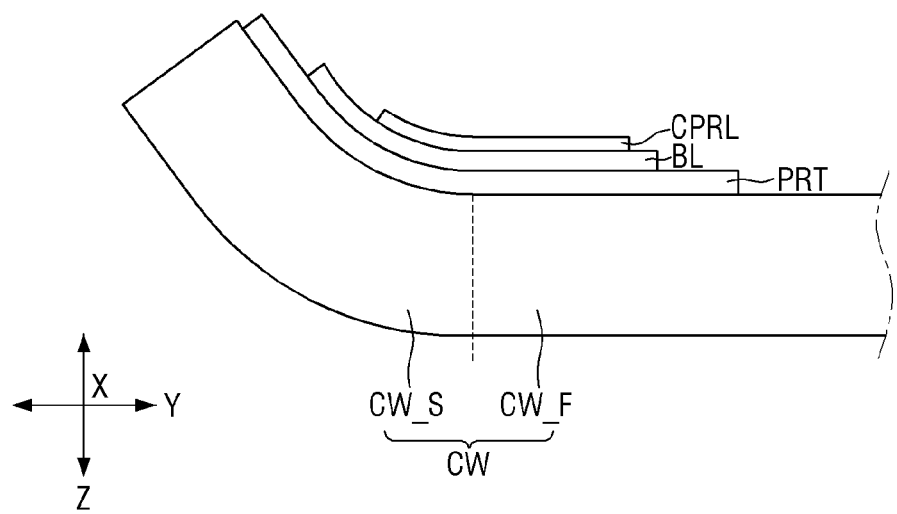

Subsequently, referring to FIG. 14, a code printed layer CPRL may be formed on the buffer layer BL. The code printed layer CPRL may be formed to have a size smaller than that of the buffer layer BL. In cross section, the code printed layer CPRL may be formed to have a width smaller than that of the buffer layer BL. The code printed layer CPRL may be formed to have a thickness equal to or less than that of the buffer layer BL. It should be understood that the embodiments described herein are not limited thereto. The code printed layer CPRL may be formed to have substantially the same size and/or thickness as the buffer layer BL. The arrangement and shape of the code printed layer CPRL have been described above with reference to FIGS. 3 to 5.

Figure 15:
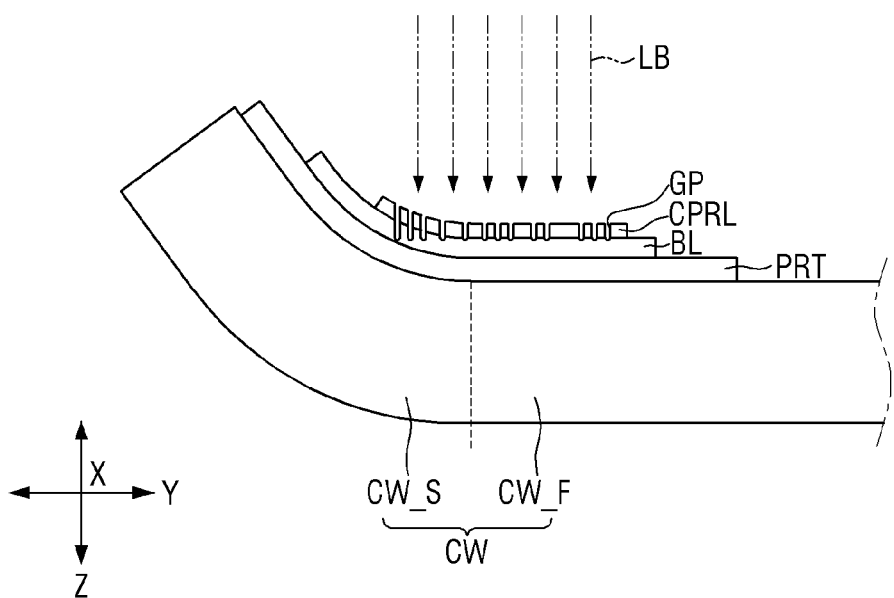

Subsequently, referring to FIG. 15, a plurality of grooves GP penetrating through the code printed layer CPRL may be formed. The plurality of grooves GP may be formed by laser etching. Specifically, a plurality of grooves GP may be formed by irradiating a laser beam emitted from a laser light source onto the code printed layer CPRL. A burr may be formed on the plurality of grooves GP by laser etching, but the embodiments described herein are not limited thereto.

Some of the grooves GP may have different depths from the others. As shown in FIG. 15, some of the grooves GP overlapping the curved portion CW_S of the cover window CW may have a greater depth than that of the others. It should be understood that the embodiments described herein are not limited thereto. The grooves GP may be formed to have substantially the same depth.

The plurality of grooves GP may be formed to penetrate through the code printed layer CPRL but not completely penetrate through the buffer layer BL. The ends of the plurality of grooves GP may be formed to be located in the buffer layer BL.

Referring further to FIG. 5, the plurality of grooves GP may form a pattern. For example, as shown in FIG. 5, the plurality of grooves GP may be formed to have a shape of a QR code. As another example, the plurality of grooves GP may be formed to have an alignment mark shape such as a cross-shape. The shape and arrangement of the plurality of grooves GP have been described above with reference to FIGS. 3 to 5.

Subsequently, the cover window CW may be attached to the display panel DP by the transparent coupling layer OCR shown in FIG. 3, etc.

Referring to FIGS. 8 and 9, the printed layer PRT, the buffer layer BL and the code printed layer CPRL may be formed on the flat portion CW_F of the cover window CW. As shown in FIG. 9, the curved portion CW_S may be eliminated at the edge of the flat portion DP_F where the printed layer PRT, the buffer layer BL and the code printed layer CPRL are formed. In this instance, the printed layer PRT, the buffer layer BL and the code printed layer CPRL may be formed to have a flat shape conforming to the shape of the flat portion CW_F of the cover window CW in cross section. When the printed layer PRT, the buffer layer BL and the code printed layer CPRL are formed on the flat portion CW_F of the cover window CW, their arrangements and shapes have been described above with reference to FIGS. 8 and 9.

In the method of fabricating a display device according to the embodiment, the buffer layer BL is formed on the printed layer before the code printed layer CPRL for forming the pattern is formed, so that it is possible to compensate for a thickness deviation of the printed layer PRT and/or the code printed layer CPRL that may occur during the fabricating process, and to obtain a sufficient thickness for forming the plurality of grooves GP irrespectively of the curved shape of the cover window CW. As a result, it is possible to clearly recognize the pattern of the code printed layer CPRL during the fabricating process, and it is possible to prevent the pattern from being recognized from the outside of the display device after the fabricating process has been completed.

Although certain embodiments and implementations have been described herein, other embodiments and modifications will be apparent from this description. Accordingly, the inventive concepts are not limited to such embodiments, but rather to the broader scope of the appended claims and various modifications and equivalent arrangements as would be apparent to a person of ordinary skill in the art.

What is claimed is:

1. A display device comprising:
    a cover window;
    a printed layer disposed on the cover window;
    a buffer layer provided on the printed layer;
    a code printed layer provided on the buffer layer; and
    a plurality of grooves penetrating through the code printed layer.

2. The display device of claim 1, wherein the printed layer is disposed adjacent to an edge of the cover window.

3. The display device of claim 1, wherein the printed layer is disposed on a flat portion of the cover window.

4. The display device of claim 1, wherein a color of the buffer layer is different from a color of the code printed layer.

5. The display device of claim 1, wherein a color of the buffer layer is identical to a color of the code printed layer.

6. The display device of claim 1, wherein a color of the code printed layer is white, and a color of the buffer layer and a color of the printed layer are black.

7. The display device of claim 1, wherein the buffer layer and the printed layer are made of a same material.

8. The display device of claim 1, wherein the buffer layer comprises a light-blocking material.

9. The display device of claim 8, wherein the light-blocking material comprises at least one of an organic material containing a black dye or a black pigment, and an opaque metal material.

10. The display device of claim 1, wherein the printed layer comprises a first printed layer disposed on the cover window and a second printed layer disposed on the first printed layer.

11. The display device of claim 1, wherein ends of the plurality of grooves are located in the buffer layer in cross section.

12. The display device of claim 1, wherein the plurality of grooves is disposed to form a pattern when viewed from top of the display device.

13. The display device of claim 12, wherein the pattern is a quick response (QR) code for identifying the cover window.

14. The display device of claim 12, wherein the pattern is an alignment mark.

15. A display device comprising:
- a cover window;
- a printed layer disposed on the cover window and comprising a plurality of layers;
- a code printed layer provided on the printed layer; and
- a plurality of grooves penetrating through the code printed layer.

16. The display device of claim 15, wherein the printed layer is disposed adjacent to an edge of the cover window.

17. The display device of claim 15, wherein the printed layer comprises a first printed layer disposed on the cover window, a second printed layer disposed on the first printed layer, and a third printed layer disposed on the second printed layer, and wherein ends of the plurality of grooves are located in the third printed layer in cross section.

18. The display device of claim 17, wherein each of the first printed layer, the second printed layer and the third printed layer has a same color.

19. The display device of claim 17, wherein each of the first printed layer, the second printed layer and the third printed layer comprises a light-blocking material.

* * * * *